United States Patent
Ja et al.

(10) Patent No.: US 7,484,192 B2
(45) Date of Patent: *Jan. 27, 2009

(54) METHOD FOR MODELING METASTABILITY DECAY THROUGH LATCHES IN AN INTEGRATED CIRCUIT MODEL

(75) Inventors: Yee Ja, Round Rock, TX (US); Bradley S. Nelson, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 177 days.

This patent is subject to a terminal disclaimer.

(21) Appl. No.: 11/532,575

(22) Filed: Sep. 18, 2006

(65) Prior Publication Data

US 2008/0072188 A1    Mar. 20, 2008

(51) Int. Cl.
*G06F 17/50* (2006.01)
*G06F 9/45* (2006.01)
(52) U.S. Cl. .................. 716/5; 716/6; 703/13; 703/14
(58) Field of Classification Search .............. 716/5–6; 703/13, 14
See application file for complete search history.

(56) References Cited

U.S. PATENT DOCUMENTS

| | | | |
|---|---|---|---|
| 5,826,061 A | 10/1998 | Walp | |
| 6,906,555 B2 | 6/2005 | Ma | |
| 6,927,604 B2 | 8/2005 | Boerstler et al. | |
| 6,998,896 B1 | 2/2006 | De La Cruz et al. | |
| 7,243,322 B1* | 7/2007 | Ly et al. | 716/5 |
| 2003/0125916 A1* | 7/2003 | Benis | 703/14 |
| 2005/0251779 A1 | 11/2005 | Chard et al. | |
| 2005/0268265 A1 | 12/2005 | Ly et al. | |

OTHER PUBLICATIONS

U.S. Appl. No. 11/279,911, filed Apr. 17, 2006, Ja et al.
Maryam Shojaei Baghini et al., "Impact of Technology Scaling on Metastability Performance of CMOS Synchronizing Latches", Proceedings of ASP-DAC/VlSI Design 2002, 6 pages.

* cited by examiner

*Primary Examiner*—Thuan Do
*Assistant Examiner*—Nghia M Doan
(74) *Attorney, Agent, or Firm*—Stephen J. Walder, Jr.; Casimer K. Salys

(57) ABSTRACT

Mechanisms for modeling metastability decay through latches in an integrated circuit model are provided. Asynchronous clock boundaries are identified in the integrated circuit model and latches in a receive clock domain are enumerated. Latches within a range of the asynchronous clock boundary are selected for transformation. These latches are transformed into metastability decay latches using new latch primitive logic that models the decay of an indeterminate value. The metastability decay latches maintains an indeterminate value during a metastability time period and achieve a randomly selected logic value at the end of the metastability time period. The transformed integrated circuit model may then be simulated and the results analyzed to generate reports of the integrated circuit model's operation. The transformed integrate circuit model more accurately represents the actual operation of the hardware implementation of the integrated circuit model.

7 Claims, 5 Drawing Sheets

METHOD FOR MODELING METASTABILITY DECAY THROUGH LATCHES IN AN INTEGRATED CIRCUIT MODEL

BACKGROUND

1. Technical Field

The present application relates generally to an improved data processing system and method. More specifically, the present application is directed to a system and method for modeling metastability decay through latches in an integrated circuit model.

2. Description of Related Art

In physical hardware integrated circuit devices, metastability is a problem that occurs in elements, e.g., flip-flops, latches, and the like, of the integrated circuit device when a data or control input is changing at the instant of a clock pulse. The result is that the output of the integrated circuit element may behave unpredictably, taking many times longer than normal to settle to its correct state or even oscillating several times before settling. In an integrated circuit device, such problems may cause corruption of data as well as other problems.

In many cases, metastability in integrated circuit devices can be avoided by ensuring that the data and control inputs are held constant for specified periods of time before and after the clock pulse. These periods of time are referred to as the setup time and the hold time, respectively. These times are specified in the data sheet for the integrated circuit device and are typically between a few nanoseconds and a few hundred picoseconds for modern integrated circuit devices.

Unfortunately, it is not always possible to meet the setup and hold time criteria because the integrated circuit element may be connected to a real-time signal that could change at any time, outside the control of the designer. In this case, the best the designer can do is to reduce the probability of error to a certain level, depending on the required reliability of the circuit.

One technique for suppressing metastability is to connect two or more integrated circuit elements, e.g., flip-flops or latches, in a chain so that the output of each one feeds the data input of the next, and all of the integrated circuit elements share a common clock. With this method, the probability of a metastable event can be reduced to a negligible value, but never to zero. For example, an integrated circuit element which attains a metastable value will assume an indeterminate value, i.e. neither a logic 0 or logic 1. This indeterminate value will be overwritten or decay to a random value, i.e. a logic 0 or logic 1, over time and/or through the use of additional integrated circuit elements provided in a chain, as mentioned above. Hence, there are two ways a metastable generated indeterminate value can be reduced to a random value—1) by using additional synchronization latches connected in a chain, or 2) by time.

In simulation of integrated circuit designs, while it is possible to model the metastability of a latch by using an indeterminate value, there currently is no ability to model the decay of such a metastable indeterminate value to a random value. In other words, during simulation of an integrated circuit design model, an indeterminate value does not decay as it would in the real physical hardware of the integrated circuit device. Thus, the only way to treat such indeterminate values in the simulation is to overwrite them with other logic in the simulation so that downstream logic of the metastable element does not see the indeterminate value. This, however, does not accurately represent the actual operation of the real physical hardware when the integrated circuit device is fabricated.

SUMMARY

In one illustrative embodiment, a method, in a data processing system, for modeling metastability in an integrated circuit device simulation is provided. The method comprises identifying an asynchronous boundary in an integrated circuit device model and inserting at least one metastability decay latch element into the integrated circuit model within a range of elements of the asynchronous boundary. The metastability decay latch models a decay of a metastable value of the latch when an indeterminate value is latched into the metastability decay latch. The method further comprises simulating an operation of the integrated circuit device using the integrated circuit device model with the inserted at least one metastability decay latch. Inserting at least one metastability decay latch element into the integrated circuit model comprises enumerating latch elements of the integrated circuit model along each path from the asynchronous boundary such that each latch element within the predetermined range has an associated enumerated depth value, identifying latch elements having an associated enumerated depth value that is less than or equal to a threshold depth value, thereby identifying candidate latch elements and replacing the candidate latch elements with metastability decay latch elements.

In other illustrative embodiments, a computer program product comprising a computer useable or readable medium having a computer readable program program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a mechanism for modeling metastability decay through latches in an integrated circuit model during simulation of the integrated circuit model. The mechanisms of the illustrative embodiments allow latches that are within a minimum synchronization latch depth from an asynchronous boundary of the integrated circuit model to be transformed into metastability decay latches which simulate the decay of metastable indeterminate values during simulation of the integrated circuit model. As a result, a more accurate simulation of the resulting hardware is achieved as opposed to conventional simulation in which latches that receive indeterminate values are simply considered to maintain the indeterminate value until it is overwritten.

The illustrative embodiments may be implemented in a single data processing system or may be distributed across a plurality of data processing systems that are coupled to one another via one or more communications networks. For example, a server computing device may provide circuit model simulation and analysis engines that may be applied to integrated circuit designs or models provided by other computing devices, such as client computing devices. A client computing device may communicate with the server computing device via the one or more communications networks so as to control the application of simulation and analysis engines of the illustrative embodiments to the integrated circuit models, which may be provided, for example, as netlist data structures, hardware description language files, or the like. Alternatively, the integrated circuit models and analysis engines may be provided entirely on the same computing device such that multiple computing devices and communication networks are not necessary. For purposes of the present description, however, it will be assumed that the illustrative embodiments are implemented in a distributed data processing system.

Figure 1:
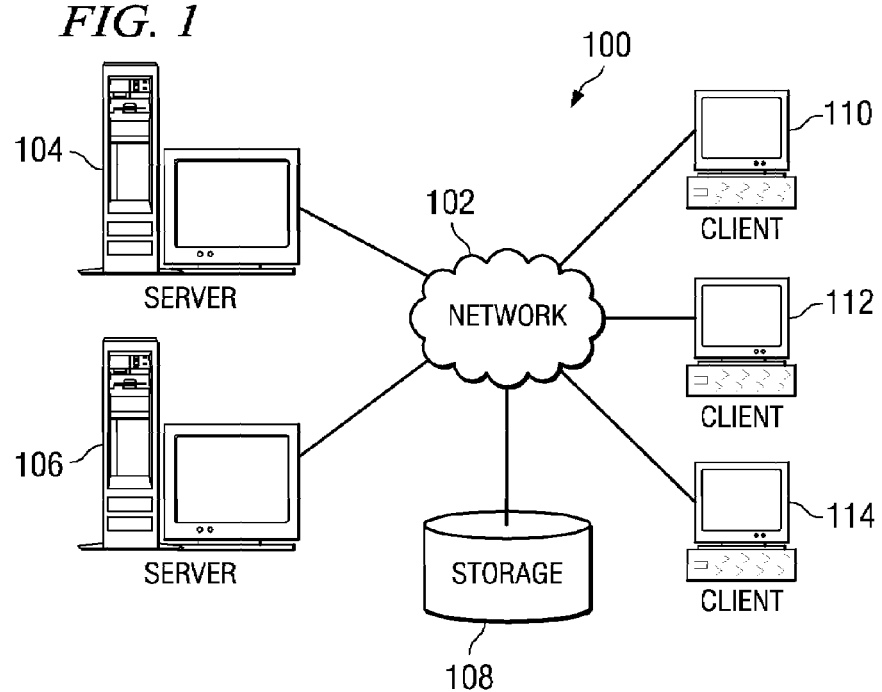
FIG. 1 is an exemplary block diagram of a distributed data processing system in which aspects of the illustrative embodiments may be implemented.
Figure 2:
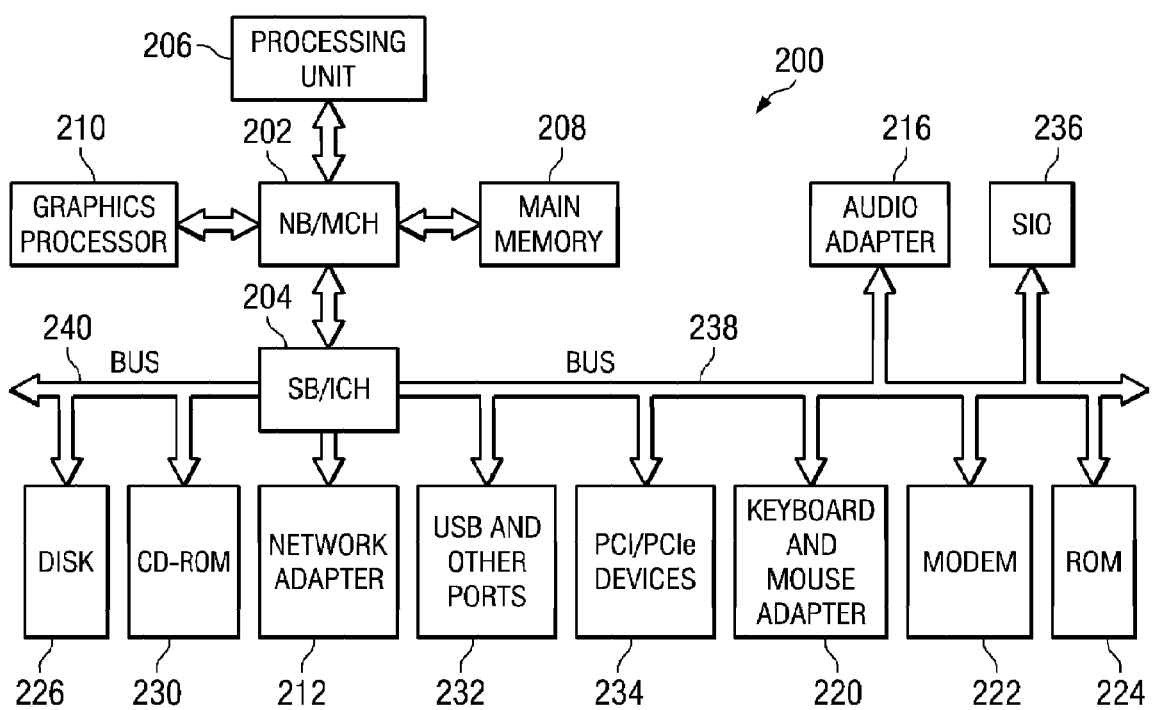
FIG. 2 is a block diagram of an exemplary data processing device in which exemplary aspects of the illustrative embodiments may be implemented.

With reference now to the figures and in particular with reference to FIGS. 1-2, exemplary diagrams of data processing environments are provided in which exemplary embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments provide a system and method for modeling metastability decay through latches in an integrated circuit model during simulation of the integrated circuit model. For example, with reference again to FIG. 1, the server 104 may provide a circuit simulation engine in accordance with the mechanisms of the illustrative embodiments. A client computing device, such as client 110, may provide an integrated circuit model to the server 104 upon which the simulation engine of server 104 is to operate in order to verify the design of the integrated circuit. This integrated circuit model may comprise, for example, a netlist data structure defining the various nets of the circuit model as well as other information, generally known in the art, regarding clock phases, clock periods, data signal information, and the like. It should be appreciated that while the illustrative embodiments will be described with regard to nets in a netlist data structure, the present invention is not limited to use of a netlist data structure. Rather, other types of data structures that provide a logic description representative of an integrated circuit design may be used without departing from the spirit and scope of the present invention. For example, a hardware description language data structure may be used to provide the necessary information for performing simulation of an integrated circuit model.

In one illustrative embodiment, a new latch primitive is provided that may be used by the simulation engine to transform latches in an integrated circuit model into latches that model the metastable decay of an indeterminate value latched into the latch. This new latch primitive operates in accordance with a normal latch primitive during normal operation and models the metastability decay when an indeterminate value is latched into the latch. Alternatively, the new latch primitive may be utilized by designers during the initial generation of an integrated circuit model for submission to the simulation engine.

It has been observed that when using an X value to model metastability or a transitioning value in logic simulation, the receive/sink latch of an asynchronous boundary may take or be driven to an X value for a duration equivalent to a maximum amount of time a latch may become metastable. Each subsequent downstream latch in the cone of logic from the initial receive/sink latch should also experience metastability decay if they latch in this X value. However, the amount of metastability decay for each subsequent latch can be represented as an inverse function of the latch depth from the asynchronous boundary.

If "n" is the number of synchronization and/or metastability latches required to resolve an indeterminate X latch value to a random value, e.g., a random logic 0 or logic 1, it should also be true that n latches deep into the receive domain, regardless of the combinational logic which may also exist between the latches or the clocking mechanism of the latches, an indeterminate value originating from an initial receive/sink latch should have already resolved to a random value. This is true because the indeterminate value would either decay before reaching the output of the nth latch or the latches would all be clocked in a manner which would optimize the forward propagation of the value, i.e. a value is staged from latch to latch until it reaches the output of the nth latch, similar to a value being propagated through synchronization latches.

As mentioned above, it should be appreciated that the "n" value referenced above assumes that the latches of the integrated circuit model are of a same type. There may be designs that actually use a variety of different types of latches. Since "n" is dependent on the physical characteristics of the latches being used, in cases where different types of latches are being used, the latches that need to be transformed or replaced in the integrated circuit model with the metastable decay latches of the illustrative embodiments may be determined based on an accumulated probability and a threshold requirement for the propagation of a metastable value into the logic.

With one illustrative embodiment, either during integrated circuit model creation or by transforming the integrated circuit model prior to performing simulation, all of the latches that are within "n" latches deep from an asynchronous boundary in the integrated circuit model are replaced by metastability decay latch primitives (referred to hereafter as "metastability decay latches"). These metastability decay latches operate normally except when they latch in an indeterminate X value. Once an X value is latched in, the metastability decay latches convert the X value to a random value after an elapsed period of time. This period is an inverse function of the enumerated depth with which the metastability decay latch resides from an asynchronous boundary or interface. The conversion of the X value to a random value only occurs if the metastability decay latch value is an X value for the duration of the elapsed time period. If a new X value is latched into the metastability decay latch while the current value is an X value, the elapsed time is reset.

Figure 3A:
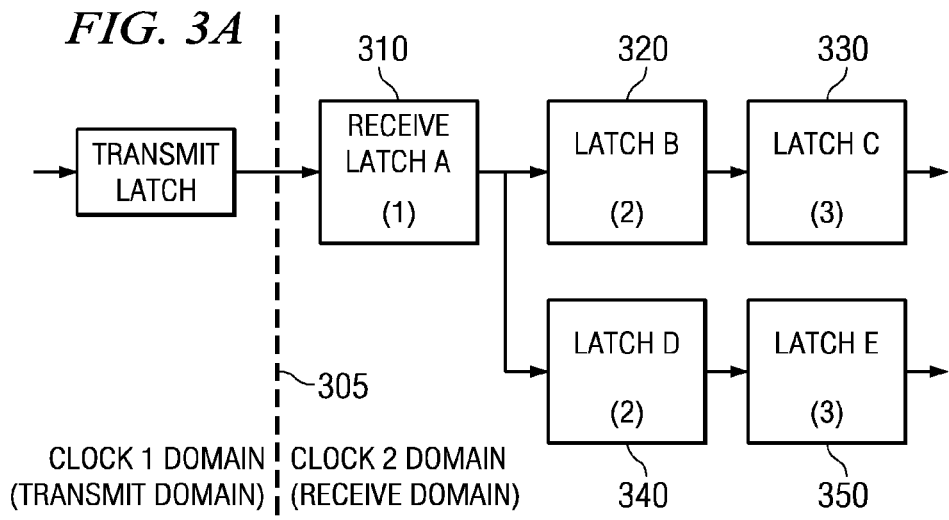
FIGS. 3A and 3B are exemplary diagrams illustrating a latch enumeration methodology in accordance with one illustrative embodiment.

In one exemplary implementation of the illustrative embodiments, as illustrated in FIG. 3A, latches in a cone of logic of each receive latch of an asynchronous boundary, i.e. the boundary between two different clock domains, in an integrated circuit design or model are enumerated by a depth count, i.e. the latch depth into the receive domain from the asynchronous boundary. This depth count is then used to determine which latches should be transformed using the new latch primitive of the illustrative embodiments so as to simulate metastability decay when indeterminate values are latched into the receive latch of the asynchronous boundary.

As shown in FIG. 3A, a receive latch A 310 of an asynchronous boundary 305 has a cone of logic 315 encompassing latches B-E 320-350. Each path from the receive latch A 310 to the latches 320-350 is traversed with each latch 310-350 being enumerated based on their depth from the asynchronous boundary 305. Thus, latch A 310 has a depth of 1 logic element from the asynchronous boundary 305, latch B 320 has a depth of 2, latch C 330 has a depth of 3. Similarly, traversing the path to latch E 350, latch A 310 has a depth of 1, latch D 340 has a depth of 2, and latch E 350 has a depth of 3. These depth values associated with the latches may be compared to a depth value "n" indicative of a number of synchronization and/or metastability latches required to resolve an indeterminate X latch value to a random value. If the depth value of a latch is less than or equal to n, then the latch is a candidate for transformation using the mechanisms of the illustrative embodiments.

Figure 3B:
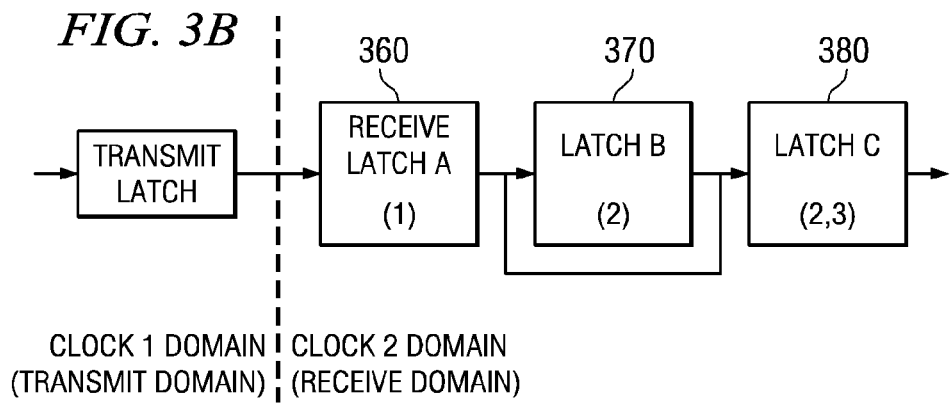

As shown in FIG. 3B, if a latch is in the cone of logic for multiple receive latches of the asynchronous boundary, or is at a different depth for different paths from the same receive latch, then its respective enumeration may not be the same for each receive latch or path. For example, in FIG. 3B there are two paths from the receive latch A 360 to the latch C 380. In a first path which goes through latch B 370, latch B 370 has a depth of 2 and latch C 380 has a depth of 3. In the second path, which bypasses latch B 370, latch C 380 has a depth of 2.

In such a case, depending upon the implementation chosen, latch C 380 may be enumerated with either the smaller or larger depth value (both values being shown in FIG. 3B for illustrative purposes only). Whether to choose the smaller or larger depth value may be dependent upon weighing the extent of testing versus the possibility of false fails. Thus, if the possibility of false fails is not significant in the simulation, the depth value for latch C 380 may be set to 2, for example.

When the nth enumeration is reached, where "n" again is the number of synchronization and/or metastability latches required to resolve an indeterminate X value to a random value, the forward enumeration of latches may be halted for that particular path in the cone of logic. Receive domain latches within the minimum synchronization latch depth from the asynchronous boundary, i.e. latches having a depth equal to or less than n, may be transformed or replaced using the new latch primitive of the illustrative embodiments. Thus, if the minimum synchronization latch depth is 3 in FIG. 3A, for example, then all of latches A-E 310-350 are candidates for transformation using the new latch primitive.

This new latch primitive provides a capacitive effect to the latches within the minimum synchronization latch depth with regard to indeterminate values. The new latch primitive has an indeterminate value for a period of time that is an inverse function of the enumerated depth with which the metastability decay latch resides from an asynchronous boundary or interface, i.e. the metastability time period. After this metastability time period, the new latch primitive assumes a random value, thereby representing the decay of the metastable indeterminate value to a random value.

In simulation, the new latch primitive starts a counter when it receives an indeterminate value. This counter is incremented with each simulator clock cycle and is compared to a metastable time period. While the counter value is less than or equal to the metastable time period, an indeterminate value is associated with the latch. When the counter value exceeds the metastable time period, the latch assumes a randomly selected logic 0 or logic 1 value.

Figure 4:
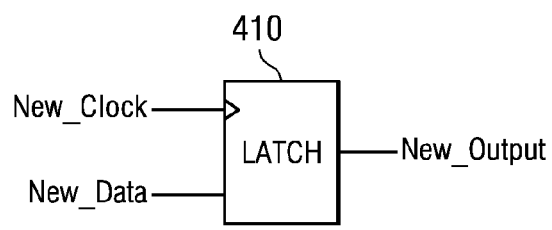
FIG. 4 is an exemplary diagram of new latch primitive logic in accordance with one illustrative embodiment.

FIG. 4 is an exemplary diagram of new latch primitive logic, i.e. metastablity decay latch logic, in accordance with one illustrative embodiment. The metastablity decay latch logic essentially generates a indeterminate X value output after receiving an indeterminate X value, up to a metastable time period, and outputs a random logic 1 or logic 0 value after the metastable time period, as described hereafter. That is, if the metastability decay latch logic of FIG. 4 receives either a new data input or a new clock input that is an indeterminate X value it outputs a new output value that is an indeterminate value for a metastable time period and is a randomly selected logic 1 or logic 0 after the metastable time period.

Figure 5:
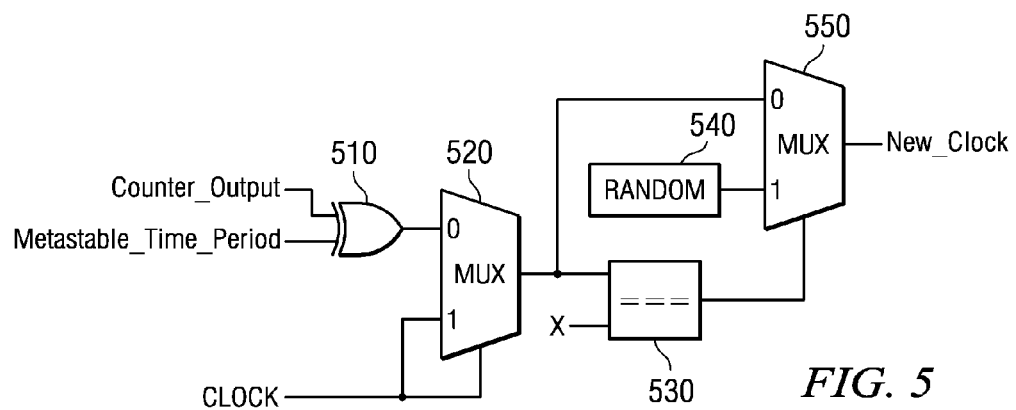
FIG. 5 is an exemplary diagram of new clock generation logic for generating a new clock signal input to the new latch primitive logic in accordance with one illustrative embodiment.
Figure 6:
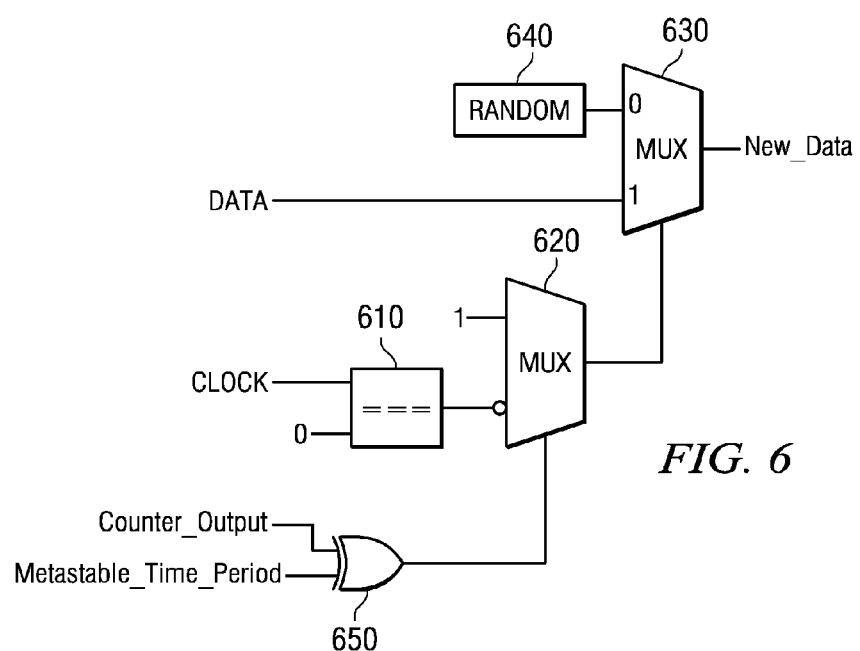
FIG. 6 is an exemplary diagram of new data generation logic for generating a new data input to the new latch primitive logic in accordance with one illustrative embodiment.
Figure 7A:
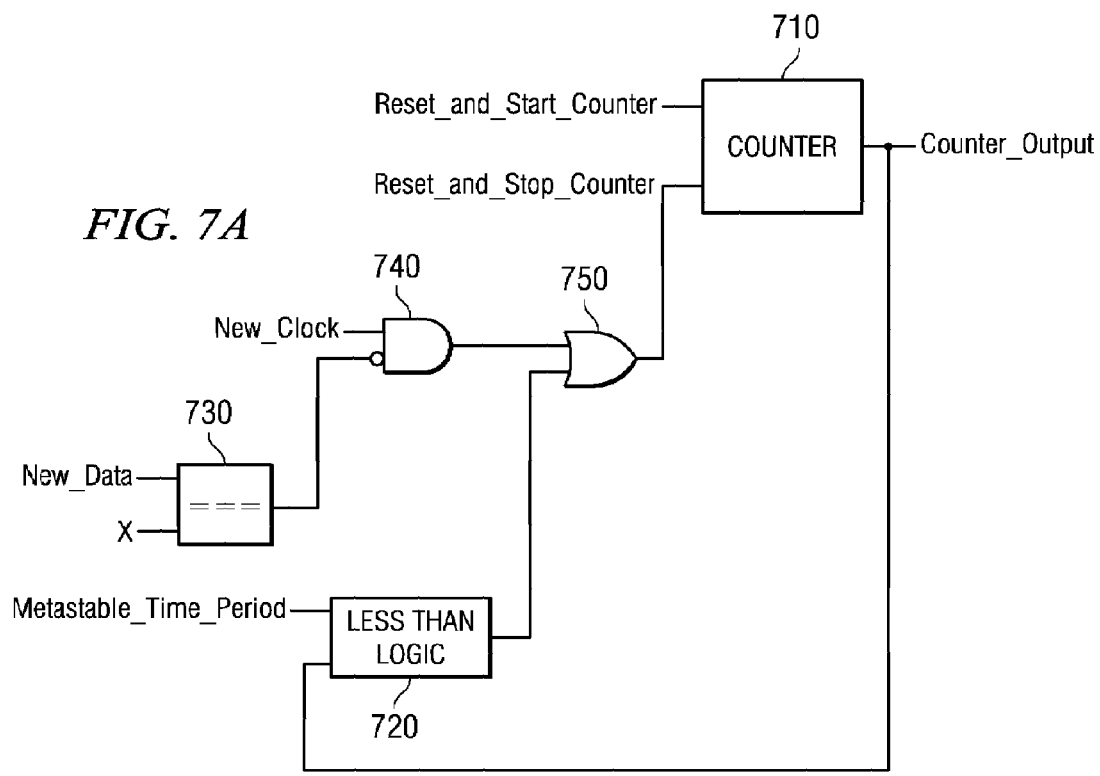
FIG. 7A is an exemplary diagram of counter logic for generating a counter output that is input to the new clock generation logic of FIG. 5 and the new data generation logic of FIG. 6 in accordance with one illustrative embodiment.
Figure 7B:
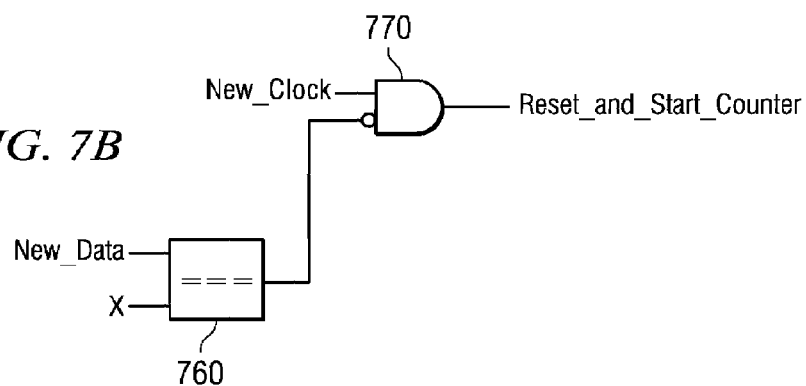
FIG. 7B is an exemplary diagram of logic for generating a reset_and_start_counter signal that is input to the counter logic of FIG. 7A in accordance with one illustrative embodiment.

The new latch primitive logic works in conjunction with the new_clock signal generation logic of FIG. 5, new_data generation logic of FIG. 6, the counter_output signal generation logic of FIG. 7A, and the reset_and_start_counter signal generation logic of FIG. 7B. The reset_and_start counter signal generation logic of FIG. 7B outputs a reset_and_start counter signal that is input to the counter_output signal generation logic of FIG. 7A. The counter_output signal generation logic of FIG. 7A outputs a counter_output signal to the new_data signal generation logic of FIG. 6 and the new_clock generation logic of FIG. 5. The new_data signal generation logic of FIG. 6 outputs a new_data signal to the new latch primitive logic of FIG. 4. Similarly, the new_clock generation logic of FIG. 5 outputs a new_clock signal that is input to the new latch primitive logic of FIG. 4.

Turning now to FIGS. 5-7B, the various logic used to generate the new_clock and new_data inputs to the new latch primitive logic of FIG. 4 will now be described. FIG. 5 is an exemplary diagram of new_clock generation logic for generating a new_clock signal input to the new latch primitive logic of FIG. 4 in accordance with one illustrative embodiment. The new clock generation logic essentially generates a new_clock signal based on whether or not a counter output of counter logic in FIG. 7A is the same as a predetermined metastable time period. The new_clock signal generated by the logic in FIG. 5 essentially provides two functions. First, it normalizes out an indeterminate X clock value to a random value. This is done since an indeterminate X clock input in simulation usually results in an indeterminate X value being an output of the latch and it is desirable instead to have a random selection of either the data input or preserving the existing value already latched. Second, when the predetermined metastable time period is reached and the original clock signal has a logic 0 value, the new_clock signal clocks the latch such that the indeterminate X data value in the latch is replaced with a randomly selected logic 0 or logic 1 value.

As shown in FIG. 5, the new clock generation logic includes an exclusive NOR (XNOR) gate 510, a first multiplexer (MUX) 520, a case equality logic block 530, random value generator logic 540, and a second MUX 550. The XNOR gate 510 receives as inputs a Counter_Output signal and a predetermined Metastable_Time_Period signal. The XNOR gate 510 outputs a logic 1 when the two inputs are the same and outputs a logic 0 when they are not the same. The output of the XNOR gate 510 is input to the MUX 520.

The MUX 520 receives a clock input, which is also used as the control input to the MUX 520, and the output from the XNOR gate 510. Thus, based on the clock input, either the output from the XNOR gate 510 or the clock input is selected for output by the MUX 520. The output from the MUX 520 is provided as an input to MUX 550 and to case equality logic block 530. The case equality logic block 530 determines if the output from the MUX 520 has an indeterminate X value and outputs a logic 1 output signal if it does have an indeterminate X value. The output of the case equality logic block 530 is provided as a control input to MUX 550.

The output of the MUX 520 may be indeterminate if the clock input has an indeterminate X value. The clock input may have an indeterminate X value, for example, if the clock pin of the latch element has an asynchronous source. However, it should be noted that an asynchronous clock is different from an asynchronous data input. The difference is that an asynchronous data input may cause metastability of the latch element during a setup/hold period of the latch element relative to the clock input. However, if the data is not transitioning, then the latch element should randomly choose between the data input and its currently latched value, i.e. the latch element should not assume an indeterminate X value just because its clock has an indeterminate X value. This behavior is modeled in the logic set forth in FIGS. 5-7B.

The case equality logic block 530 may be a Verilog case equality logic block as is generally known in the art. Essentially, the case equality logic block 530 compares its inputs bit by bit to determine if the inputs are equal. If the inputs are equal, the case equality logic block asserts an output signal. Such case equality logic blocks may be characterized using the following truth table which represents the expression C:=(A==B):

TABLE 1

Truth Table for Case Equality Logic Block

| A | B | C |
|---|---|---|
| 0 | 0 | 1 |
| 0 | 1 | 0 |
| 0 | X | 0 |
| 1 | 0 | 0 |
| 1 | 1 | 1 |
| 1 | X | 0 |
| X | 0 | 0 |
| X | 1 | 0 |
| X | X | 1 |

It is the last row of the above truth table that is being checked using the case equality logic block 530 of FIG. 5. Only when the output of MUX 520 is indeterminate is the output of the case equality logic block 530 a logic 1.

The MUX 550 receives the output from MUX 520 and an output from random value generator logic 540. Based on the output from the case equality logic block 530, the MUX 550 outputs either the input from MUX 520 or the input from the random value generator logic 540 as the New_Clock output. This New_Clock output is input to the latch 410 in FIG. 4 as previously described.

FIG. 6 is an exemplary diagram of new data generation logic for generating a new data input to the new latch primitive logic in accordance with one illustrative embodiment. The new data generation logic essentially generates a new data signal which operates to replace data in the latch with a randomly selected value, i.e. randomly selected logic 1 or logic 0, when the metastable_time_period has been reached and the original clock has a logic 0 value. When the metastable_time_period has been reached and the original clock has a logic 1 or indeterminate X value, the original data in the latch is used. When the metastable_time_period has not been reached, the original data in the latch is always used.

As shown in FIG. 6, the new data generation logic includes a case equality logic block 610, a first MUX 620, a second MUX 630, a random value generator logic 640, and an XNOR logic block 650. The original clock signal and a logic 0 input are provided to the case equality logic block 610. The case equality logic block 610 determines if the original clock has a logic 0 state and if so, outputs an output signal having a logic 1 state; otherwise the output of the case equality logic block 610 has a logic 0 state. The output of the case equality logic block 610 is provided to the first MUX 620 and is inverted at the input to MUX 620.

The MUX 620 further receives a logic 1 input and an output from XNOR logic block 650 as the selector signal for the MUX 620. The XNOR logic block 650 receives a counter_output signal and the metastable_time_period signal as inputs and generates an output signal that has a logic 1 state only when the counter_output signal and the metastable_time_period signal are the same. Thus, when the counter_output and metastable_time_period are the same, the inverted output from the case equality logic block 610 is selected as the output of MUX 620 which is provided to MUX 630 as its select signal. When the counter_output and metastable_time_period are not the same, the MUX 620 outputs a logic 1 output signal to MUX 630.

The MUX 630 selects between the original data input signal and a randomly selected logic 0 or logic 1 value output by the random logic block 640. If the metastable_time_period has been reached by the counter_output signal and the original clock has a logic 0 value, a random value is output by MUX 630 as the new_data output signal. If the metastable_time_period has been reached by the counter_output signal and the original clock has a logic 1 or indeterminate X value, then the original data is output by MUX 630 as the new_data signal. If the metastable_time_period has not been reached by the counter_output signal, then the original data is output by MUX 630 as the new_data signal.

FIG. 7A is an exemplary diagram of counter logic for generating a counter output that is input to the new clock generation logic of FIG. 5 and the new data generation logic of FIG. 6 in accordance with one illustrative embodiment. The counter logic in FIG. 7A essentially increments a counter as long as the counter value is less than a predetermined metastable time period and does not receive a reset signal.

As shown in FIG. 7A, the counter logic includes a counter 710, a "less than" logic block 720, a case equality logic block 730, an AND gate 740, and an OR gate 750. The case equality logic block 730 determines if a new_data input (which is provided by the logic of FIG. 6 above) is an indeterminate X value or not. If the new_data input is not indeterminate, the case equality logic block 730 outputs a logic 0 signal which is inverted at the input of AND gate 740. If the new_data input is indeterminate, i.e. the original data input is indeterminate in FIG. 6 and either the original clock has a logic 1 or indeterminate X state or the counter_output has not reached the metastable_time_period, then the case equality logic block 730 outputs a logic 1 signal which is inverted at the input of AND gate 740.

When the new_clock input to AND gate 740 (which is provided by the logic shown in FIG. 5 above), and the inverted output from case equality logic block 730 are the same, the AND gate 740 outputs a logic 1 signal to OR gate 750; otherwise the AND gate outputs a logic 0 signal. The less than logic block 720 outputs a logic 0 signal to the OR gate 750 if the counter_output is less than the metastable_time_period and outputs a logic 1 signal if the counter_output is equal to or greater than the metastable_time_period. If either the output from AND gate 740 or the output from the less than logic 720 is a logic 1, then the OR gate 750 outputs a logic 1 signal to the counter 710.

The counter 710 increments, after having been started by the assertion of the reset_and_start_counter signal, with each simulation cycle unless it receives an asserted reset_and_stop_counter signal. Thus, the counter 710 is stopped, i.e. the reset_and_stop_counter signal is asserted, only if either the counter_output is equal to or greater than the metastable_time_period or the new_clock has a logic 1 state and the new_data is not indeterminate. If the new_data is indeterminate, the new_clock has a logic 0 state, and the counter_output is less than the metastable_time_period, then the counter 710 is permitted to continue incrementing with each simulation cycle.

FIG. 7B is an exemplary diagram of logic for generating a reset_and_start_counter signal that is input to the counter logic of FIG. 7A in accordance with one illustrative embodiment. As shown in FIG. 7B, the reset_and_start_counter signal generation logic includes a case equality logic block 760 and an AND gate 770. The case equality logic block 760 determines if the new_data input has an indeterminate X value and, if so, outputs a logic 1 signal. The AND gate 770 asserts the reset_and_start_counter signal if the new_clock input signal has a logic 1 value and the new_data signal has an indeterminate X value.

Together, the logic illustrated in FIGS. 4-7B operates to cause the counter 710 to reset and restart incrementing in response to the latch 410 receiving a new indeterminate data value. The counter 710 increments until it reaches a predetermined metastable time period. During this metastable time period, new data values and new clock values are generated by the logic shown in FIGS. 5 and 6. These new data and new clock values are either an indeterminate value during the metastable time period or a randomly selected logic 0 or logic 1 value outside of this metastable time period. As a result, the latch 410 outputs an indeterminate value during the metastable time period and outputs a randomly selected logic 0 or logic 1 at the end of the metastable time period. When the input to the latch 410 is not indeterminate, the counter 710 is stopped and reset.

Figure 8:
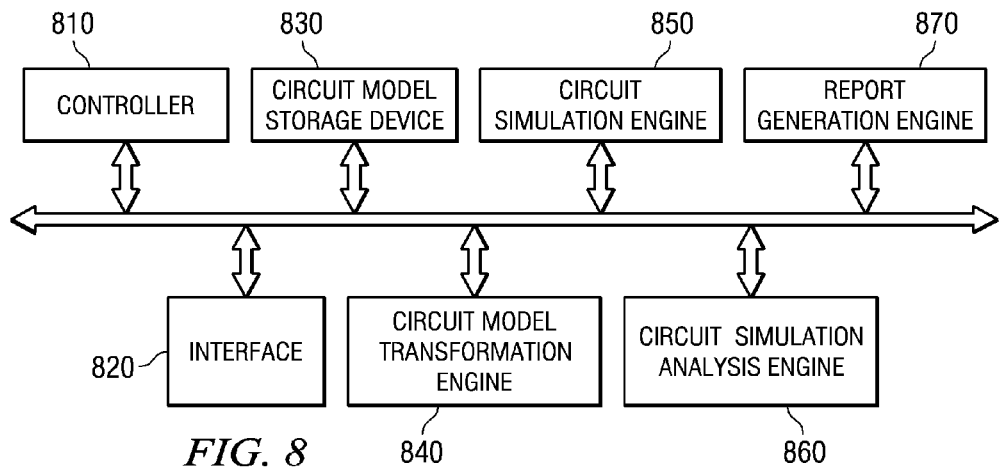
FIG. 8 is an exemplary block diagram of the primary operational elements of a circuit simulation system in accordance with one illustrative embodiment.

FIG. 8 is an exemplary block diagram of the primary operational elements of a circuit simulation system in accordance with one illustrative embodiment. As shown in FIG. 8, the circuit simulation system 800 includes a controller 810, an interface 820, a circuit model storage device 830, a circuit model transformation engine 840, a circuit simulation engine 850, a circuit simulation analysis engine 860, and a report generation engine 870. The elements 810-870 may be implemented in hardware, software, or any combination of hardware and software. In one illustrative embodiment, the elements 810-870 are implemented as software instructions executed by one or more data processing devices.

The controller 810 controls the overall operation of the circuit simulation system 800 and orchestrates the operation of the other elements 820-870. The interface 820 provides a communication interface through which integrated circuit model information may be received from other applications and/or other computing devices. The interface 820 may be a network interface through which integrated circuit model information may be received from one or more client devices and results of simulation may be provided to the one or more client devices. The interface 820 may also be an interface through which user input is received to configure simulations performed by the circuit simulation system 800.

The circuit model storage device 830 stores the integrated circuit model information obtained through the interface 820 for use in performing simulation. This circuit model information may include, for example, one or more netlist data structures specifying the nets of the integrated circuit model, phase and/or periodicity information of clock signals of the integrated circuit model, as well as other information that typically makes up an integrated circuit model as is generally known in the art. From the clock information, various asynchronous clock boundaries may be identified in the integrated circuit model.

The circuit model transformation engine 840 operates on the integrated circuit model in the circuit model storage device 830 to identify asynchronous clock boundaries, enumerate latches in the receive clock domains of the asynchronous clock boundaries, and transform latches within a number of synchronization and/or metastability latches required to resolve an indeterminate X value to a random value. In one illustrative embodiment, the transformation replaces the regular latch logic with the logic illustrated in FIGS. 4-7. It should be appreciated that other logic that provides similar functionality to that shown in FIGS. 4-7 may be used with the illustrative embodiments without departing from the spirit and scope of the present invention.

The circuit simulation engine 850 performs simulation of the transformed integrated circuit model that includes the new latch primitive logic. The circuit simulation analysis engine 860 analyzes the results of the circuit simulation in a manner generally known in the art. This analysis may identify problems in the behavior of the integrated circuit model based on specified desired operational behavior, for example, so that notifications may be generated for informing a human designer of areas where the integrated circuit model may need to be modified. The report generation engine 870 may generate such reports for output to user, such as via the interface 820 to a client device, for example. The analysis of simulation results and generation of reports is generally known in the art.

Figure 9:
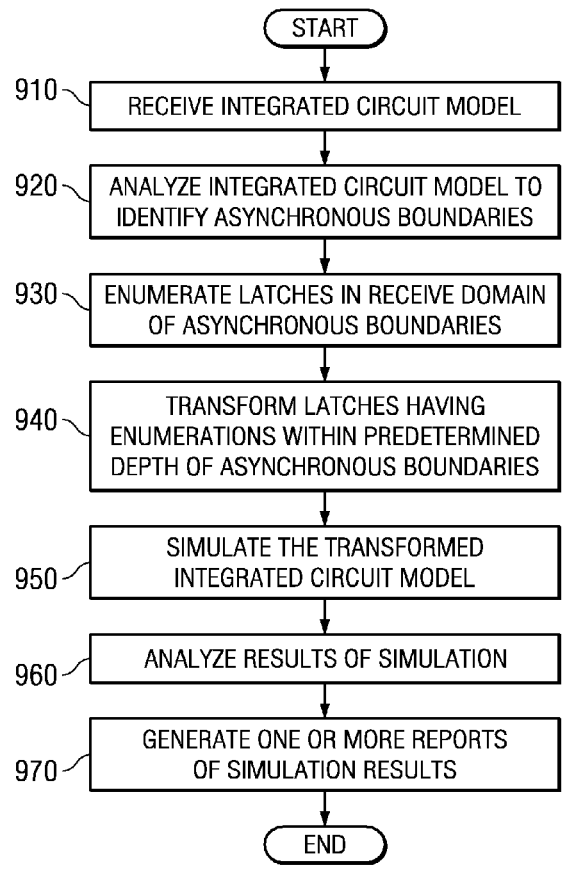
FIG. 9 is a flowchart outlining an operation for performing a simulation of an integrated circuit model in accordance with one illustrative embodiment.

FIG. 9 is a flowchart outlining an operation for performing a simulation of an integrated circuit model in accordance with one illustrative embodiment. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 9, the operation starts by the circuit simulation system receiving an integrated circuit model (step 910). The circuit simulation system analyzes the integrated circuit model to identify asynchronous boundaries (step 920). The circuit simulation system enumerates latches in the receive domain of the asynchronous boundaries (step 930). The circuit simulation system transforms the latches having enumerated values within a predetermined depth of the asynchronous boundaries (step 940). The circuit simulation system then simulates the transformed integrated circuit model (step 950). The circuit simulation system analyzes the results of the simulation of the transformed integrated circuit model (step 960) and generates one or more reports for informing a user of results of the simulation (step 970). The operation then terminates.

Thus, the illustrative embodiments provide a system and method for modeling metastable decay in an integrated circuit simulation. In the illustrative embodiments, latches of a receive clock domain of an asynchronous clock boundary may be replaced with metastability decay latches using the new latch primitive logic of the illustrative embodiments. The metastability decay latches provide a capacitive effect with regard to indeterminate values latched into the metastability decay latches such that the indeterminate value is changed to a randomly selected logic value at the end of a predetermined metastability time period. In this way, when the integrated circuit model is simulated, the results of the simulation will more accurately reflect the actual operation of the hardware implementation of the integrated circuit model.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for modeling metastability in an integrated circuit device simulation, comprising:

identifying an asynchronous boundary in an integrated circuit device model;

inserting at least one metastability decay latch element into the integrated circuit model within a range of elements of the asynchronous boundary, wherein the metastability decay latch models a decay of a metastable value of the latch when an indeterminate value is latched into the metastability decay latch; and simulating an operation of the integrated circuit device using the integrated circuit device model with the inserted at least one metastability decay latch, wherein inserting at least one metastability decay latch element into the integrated circuit model comprises:

enumerating latch elements of the integrated circuit model along each path from the asynchronous boundary such that each latch element within the predetermined range has an associated enumerated depth value;

identifying latch elements having an associated enumerated depth value that is less than or equal to a threshold depth value, thereby identifying candidate latch elements; and replacing the candidate latch elements with metastability decay latch elements.

2. The method of claim 1, wherein the threshold depth value is a number of latch elements required to resolve an indeterminate latch value to either a logic 0 value or a logic 1 value.

3. The method of claim 1, wherein enumerating latch elements of the integrated circuit model along each path from the asynchronous boundary is performed with regard to a receive domain of the asynchronous boundary.

4. The method of claim 1, wherein the at least one metastability decay latch element is a latch element that operates as a normal latch element until an indeterminate value is latched into the latch element, and wherein the at least one metastability decay latch element converts an indeterminate value to a randomly selected logic 0 value or logic 1 value after an elapsed period of time when an indeterminate value is latched into the latch element.

5. The method of claim 4, wherein the elapsed period of time for a particular metastability decay latch is an inverse function of an associated enumerated depth value of the metastability decay latch.

6. The method of claim 1, wherein:

the at least one metastability decay latch element is a metastability latch element that starts a counter when the latch element receives an indeterminate value, the counter being incremented with each simulator clock cycle and compared to a metastable time period, while the counter value is less than or equal to the metastable time period, an indeterminate value is associated with the latch, and when the counter value exceeds the metastable time period, the latch element assumes a randomly selected logic 0 value or logic 1 value.

7. The method of claim 1, wherein the at least one metastability decay latch element comprises:

a counter that generates a counter output, the counter output being incremented with each simulation clock cycle until reset;

new clock generation logic that outputs either an original clock signal value or a randomly generated clock signal value based on whether or not a counter output equals a metastable time period; and new data generation logic that outputs either an original data signal value or a randomly generated data signal value based on whether or not the counter output equals the metastable time period.

* * * * *